(12) United States Patent
Bandyopadhyay et al.

(10) Patent No.: US 11,476,631 B2
(45) Date of Patent: Oct. 18, 2022

(54) PHOTONIC CHIP INTEGRATED WITH A FIBER LASER

(71) Applicant: Elenion Technologies, LLC, New York, NY (US)

(72) Inventors: Saumil Bandyopadhyay, New York, NY (US); Michael J. Hochberg, New York, NY (US)

(73) Assignee: Nokia Solutions and Networks Oy, Espoo (FI)

( * ) Notice: Subject to any disclaimer, the term of this patent is extended or adjusted under 35 U.S.C. 154(b) by 136 days.

(21) Appl. No.: 16/693,328

(22) Filed: Nov. 24, 2019

(65) Prior Publication Data
US 2021/0159659 A1 May 27, 2021

(51) Int. Cl.
| | |
|---|---|
| *H01S 3/067* | (2006.01) |
| *G02B 6/12* | (2006.01) |
| *H01S 3/00* | (2006.01) |
| *G02B 6/293* | (2006.01) |
| *H01S 3/094* | (2006.01) |
| *H01S 3/091* | (2006.01) |
| *H01S 5/14* | (2006.01) |

(52) U.S. Cl.
CPC ...... *H01S 3/06758* (2013.01); *G02B 6/12004* (2013.01); *G02B 6/29341* (2013.01); *H01S 3/0078* (2013.01); *H01S 3/06704* (2013.01); *H01S 3/0912* (2013.01); *H01S 3/094053* (2013.01); *H01S 5/146* (2013.01); *G02B 2006/12109* (2013.01)

(58) Field of Classification Search
CPC ............. H01S 3/06758; H01S 3/06704; H01S 3/0078; H01S 3/094053; H01S 3/0912; H01S 3/08; H01S 3/106; H01S 3/08027; H01S 3/094049; H01S 3/082; H01S 3/06791; H01S 3/094003; G02B 6/29341; G02B 6/12004; G02B 2006/12109; G02B 6/3596; G02B 2006/12123; G02B 6/12007; G02B 6/4215; G02B 6/29395; G02B 6/29343
See application file for complete search history.

(56) References Cited

U.S. PATENT DOCUMENTS

| | | | |
|---|---|---|---|
| 8,396,337 | B2 | 3/2013 | Kroemer et al. |
| 9,261,754 | B2 | 2/2016 | Xu et al. |
| (Continued) | | | |

OTHER PUBLICATIONS

X. Wang et al., "On-chip silicon photonic wavelength control of optical fiber lasers." Opt. Exp. (16) 20, 15671, 2008 (Year: 2008).*
(Continued)

*Primary Examiner* — Xinning(Tom) Niu
(74) *Attorney, Agent, or Firm* — Stratford Group Ltd.

(57) ABSTRACT

Photonic chip includes an external cavity (EC) optical circuit to provide wavelength-selective optical feedback to a length of active optical fiber. Light generated in the active optical fiber may be coupled from the EC circuit to a light processing circuit of the photonic chip, such as an optical modulator or an optical mixer. The EC circuits may include single-frequency and multi-frequency optical filters, which may include ring resonators, dual-ring resonators, and optical modulators to support multi-frequency lasers. The EC circuits may further include pump combiners and optical isolators.

10 Claims, 11 Drawing Sheets

(56) References Cited

U.S. PATENT DOCUMENTS

| | | | |
|---|---|---|---|
| 9,490,605 B2 | 11/2016 | Gaeta et al. | |
| 9,762,334 B2* | 9/2017 | Chang | H04B 10/801 |
| 2015/0109661 A1* | 4/2015 | Li | G02B 6/29343 |
| | | | 359/341.4 |
| 2016/0018319 A1* | 1/2016 | Hegyi | G02B 6/12009 |
| | | | 356/73.1 |
| 2016/0134078 A1 | 5/2016 | Gaeta et al. | |
| 2019/0027899 A1* | 1/2019 | Krishnamoorthy | H01S 5/065 |
| 2019/0108161 A1* | 4/2019 | Nagarajan | H04L 27/0008 |

OTHER PUBLICATIONS

H. Guan et al., "Widely-tunable, narrow-linewidth III-V/silicon hybrid external-cavity laser for coherent communication." Opt. Exp. (26) 7, 7920, 2018.

J. Yao et al., "Multiwavelength erbium-doped fiber ring laser incorporating an SOA-based phase modulator." IEEE Photon. Technol. Lett. (17) 4, 756, 2005.

A. Bellemare et al., "Room temperature multifrequency erbium-doped fiber lasers anchored on the ITU frequency grid." J. Lightwave Technol. (18) 6, 825, 2000.

J. Yao et al., "Multiwavelength actively mode-locked fiber ring laser with suppressed homogenous line broadening and reduced supermode noise." Opt. Exp. (12) 19, 4529, 2004.

X. Wang et al., "On-chip silicon photonic wavelength control of optical fiber lasers." Opt. Exp. (16) 20, 15671, 2008.

Jian Yao et al, "Investigation of Room-Temperature Multiwavelength Fiber-Ring Laser That Incorporates an SOA-Based Phase Modulator in the Laser Cavity", J. Lightwave Technol., vol. 23, No. 8, Aug. 2005, p. 2484.

* cited by examiner

PHOTONIC CHIP INTEGRATED WITH A FIBER LASER

FIELD

The invention generally relates to photonic integrated circuits and components thereof.

BACKGROUND

Photonic integration circuits (PICs) are used in various data communication applications, in particular in conjunction with laser sources to implement optical transceivers. In a silicon photonics platform, an off-chip semiconductor laser is typically used as the laser source. The laser's wavelength may be tuned by adjusting an external cavity which can be formed by Bragg gratings, etalons, or filters. While this solution is employed in some existing commercial products, the packaging and aligning of the laser and PIC is complex and scales in difficulty with the number of wavelength channels. Each channel may require its own separate laser and PIC, exacerbating the complexity of packaging and alignment.

SUMMARY

Accordingly, one aspect of the present disclosure relates to a photonic chip comprising a light processing circuit, an external cavity (EC) circuit configured for connecting to an active optical fiber (AOF) to form a laser cavity therewith, and an optical coupler configured to optically couple the EC circuit to the light processing circuit for feeding light produced in the AOF to the light processing circuit.

In some implementations the photonic chip may be configured for receiving or transmitting light signals, and the light processing circuit may comprise at least one of an optical modulator or an optical mixer.

In some implementations the photonic chip may further comprise a pump combiner configured to couple pump light into the EC circuit.

In some implementations the photonic chip may comprise one or more EC ports for connecting to the AOF, wherein the EC circuit is optically coupled to the one or more EC ports and comprises an optical filter configured to select one or more distinct wavelengths of the light received from the AOF for returning back to the AOF.

In some implementations the one or more EC ports comprise first and second EC ports for connecting to opposite ends of the AOF. The optical filter may be disposed in an optical path between the first EC port and the second EC port.

In some implementations the one or more EC ports comprise a bi-directional EC port for connecting to the AOF, and the optical filter comprises a reflector. In some implementations the reflector may comprise a waveguide Sagnac loop.

In some implementations the EC circuit may comprise an on-chip optical isolator.

In some implementations the optical filter may comprise one or more dual-ring Vernier (DRV) filters. In some implementations the EC circuit comprises a first waveguide and a second waveguide, and the one or more DRV filters comprise a first micro-ring resonator evanescently coupled to the first waveguide, and a second micro-ring resonator evanescently coupled to the second waveguide. In some implementations the first waveguide is optically coupled to the at least one EC port, and the second waveguide is optically coupled to one of: a reflector, or the at least one EC port.

In some implementations the one or more DRV filters comprise a plurality of DRV filters tuned to select a plurality of wavelengths. In some implementations the optical filter may further comprise one or more phase modulators (PMs) disposed optically in series with the DRV filters. The one or more PMs may be configured to redistribute optical power generated in the AOF between a plurality of laser wavelengths for effecting multi-mode lasing. The one or more PMs may be configured to suppress mode competition by elastically expanding and contracting the cavity length at a frequency exceeding a relaxation rate in the AOF.

In some implementations the optical coupler may comprise a bi-directional coupler configured to direct, into the light processing circuit, a fraction of light propagating in the EC circuit in a first direction combined with a fraction of light propagating in the EC circuit in a second direction opposite to the first direction. In some implementations the bi-directional coupler may comprise a 2×2 coupler and a loop waveguide optically coupled to the EC circuit, the 2×2 coupler comprising two input ports interconnected by the loop waveguide, a first output port coupled to the light processing circuit, and a second output port coupled to a first monitoring photodetector (MPD).

In some implementations the optical filter may comprise a comb filter configured to select a plurality of wavelengths for returning back to the AOF. In some implementations the EC circuit may comprise a phase modulator (PM) configured to effect multi-wavelength lasing. In some implementations the PM may be configured to modulate an optical length of the EC circuit at a rate greater than a relaxation rate of a gain medium of the AOF. In some implementations the comb filter may comprises a micro-ring resonator. In some implementations the PM may comprises one of a p/n junction or a resistive heater.

In some implementations the EC circuit may be configured to cooperate with the AOF to cause lasing at a plurality of wavelengths, and the photonic chip may further comprise an optical demultiplexer.

In some implementations the EC circuit may comprise a Fabry-Perot etalon, which may be configured to operate as a wavelength reference.

An aspect of the present disclosure relates to an optical transceiver comprising: an active optical fiber (AOF) configured to emit light; and, a photonic chip coupled to the AOF. The photonic chip may comprise an optical communication circuit comprising at least one of an optical modulator or an optical mixer, and an external cavity (EC) circuit. The EC circuit may comprise one or more EC ports connected to the AOF to receive the light therefrom and to return a first portion thereof back to the AOF, an optical filter configured to filter the light to select one or more distinct wavelengths, and an optical coupler disposed to couple a second portion of the light to the first optical circuit.

BRIEF DESCRIPTION OF THE DRAWINGS

Embodiments disclosed herein will be described in greater detail with reference to the accompanying drawings, which may be not to scale and in which like elements are indicated with like reference numerals, and wherein.

DETAILED DESCRIPTION

In the following description, for purposes of explanation and not limitation, specific details are set forth, such as particular optical circuits, circuit components, techniques, etc. in order to provide a thorough understanding of the present disclosure. However, it will be apparent to one skilled in the art that the present disclosure may be practiced in other embodiments that depart from these specific details. In other instances, detailed descriptions of well-known methods, devices, and circuits are omitted so as not to obscure the disclosure. All statements herein reciting principles, aspects, and embodiments, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Furthermore, the following abbreviations and acronyms may be used in the present document:
GaAs Gallium Arsenide
InP Indium Phosphide
$LiNO_3$ Lithium Niobate
PIC Photonic Integrated Circuits
SOI Silicon on Insulator
PSK Phase Shift Keying
BPSK Binary Phase Shift Keying
QAM Quadrature Amplitude Modulation
QPSK Quaternary Phase Shift Keying
QM Quadrature Modulator
RF Radio Frequency Note that as used herein, the terms "first", "second" and so forth are not intended to imply sequential ordering, but rather are intended to distinguish one element from another, unless explicitly stated. Similarly, sequential ordering of method steps does not imply a sequential order of their execution, unless explicitly stated. The word 'using', when used in a description of a method or process performed by an optical device such as a polarizer or a waveguide, is to be understood as referring to an action performed by the optical device itself or by a component thereof rather than by an external agent.

Figure 1:
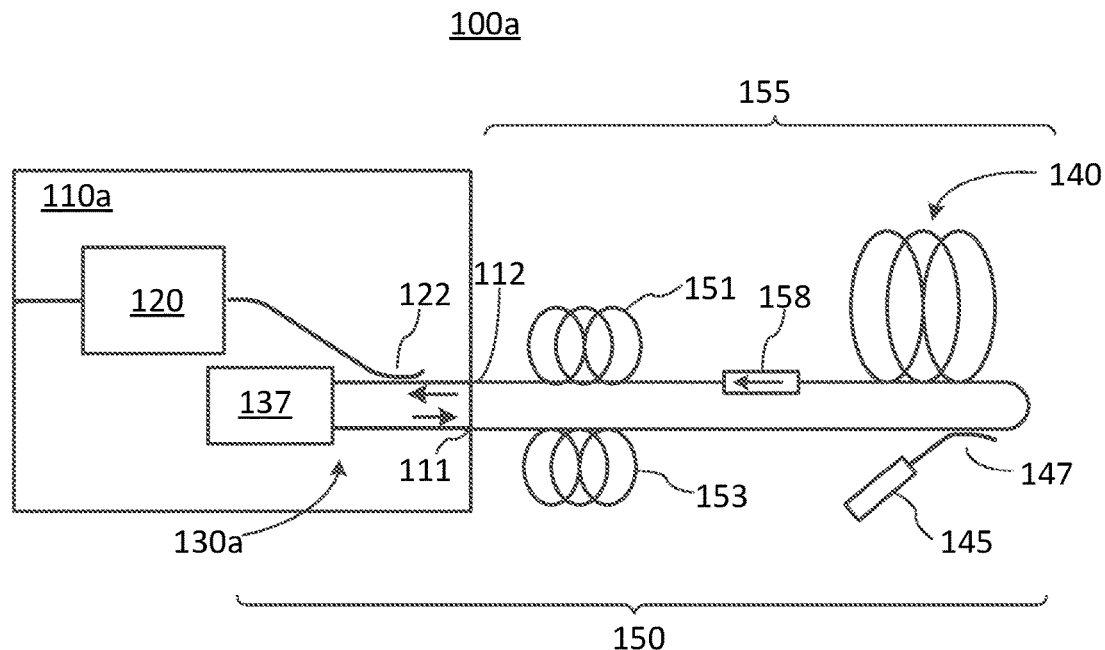
FIG. 1 is a schematic diagram of an example PIC with a light processing circuit and two external cavity (EC) ports connecting to an active fiber loop.
Figure 2:
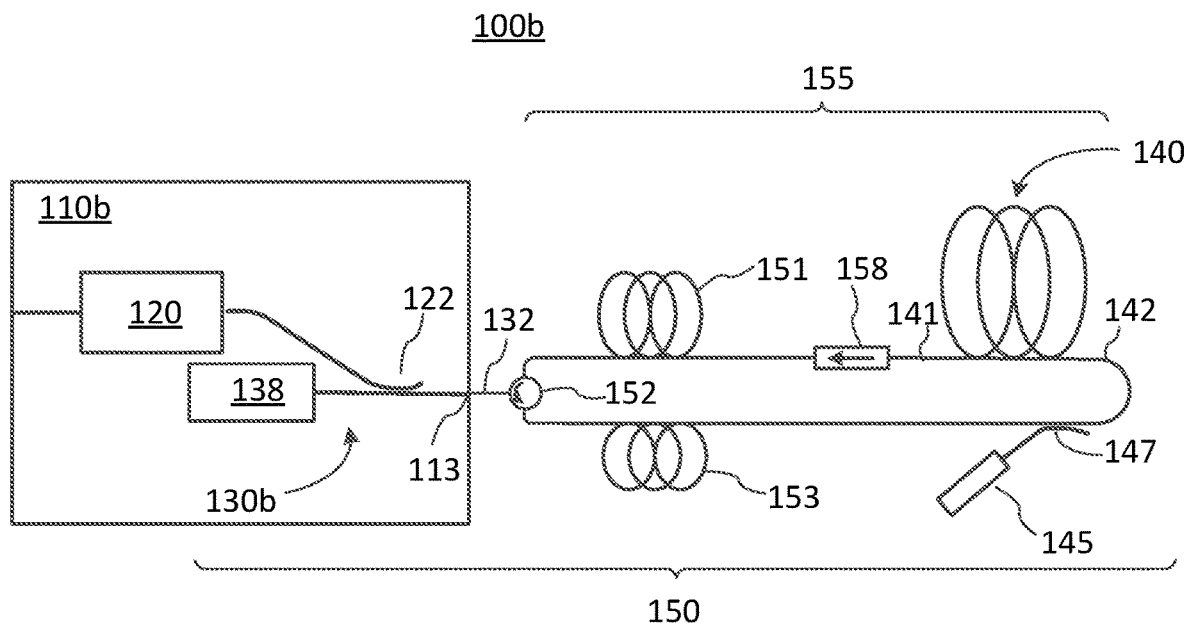
FIG. 2 is a schematic diagram of an example PIC with a light processing circuit and one EC port connecting to an active fiber loop through a circulator.

FIGS. 1-6 schematically illustrate example embodiments 100a-100f of a hybrid optical device that will generally be referred to as device 100. In each of these embodiments a photonic chip is optically coupled to an optical fiber tail 155 comprising an active optical fiber (AOF) 140. In some embodiments the photonic chip may be physically attached to the optical fiber tail 155. In some embodiments the optical fiber tail 155 may be in the form of a fiber-optic loop. The AOF may be a length of a suitably doped optical fiber that is capable of amplifying and emitting light when suitably pumped. The photonic chip, which is indicated in FIGS. 1-6 at 110a-110f respectively and which may be generally referred to herein as chip 110, provides wavelength-selective optical feedback to the AOF 140, so as to form an external cavity (EC) fiber laser that is integrated with the chip. In some embodiments this chip-integrating EC fiber laser, which is indicated in FIGS. 1 and 2 at 150, may serve as a light source for a light processing (LP) circuit 120 that may be implemented in the chip to perform a desired function. In some embodiments the LP circuit 120 may provide the chip its target functionality, such as for example transmission and/or reception of data-carrying optical signals. In some embodiments device 100 may be an optical transceiver.

Each of the photonic chips 110a-110f includes a variant of an integrated optical circuit that is configured to provide wavelength-selective optical feedback to the AOF 140 to cause the AOF to lase at one or more selected wavelengths $\lambda_i$, i=1, . . . , N, where N is an integer equal or greater than 1. This integrated optical circuit, example embodiments of which are indicated in FIGS. 1-6 at 130a-130f, may be generally referred to as the EC circuit 130 or as the first optical circuit 130. When connected to the AOF 140, an EC circuit 130 cooperates therewith to form the EC fiber laser 150 that may generate laser light for the LP circuit 120. Pump energy needed to support lasing may be coupled into the AOF 140 from a pump source 145 using a pump combiner 147. By way of example, the AOF 140 may be a length of an erbium-doped fiber (EDF), and the pump source 145 may be a pump laser diode operating at a wavelength suitable for pumping the EDF, for example at 980 nm. AOFs doped with other rear-earth elements may also be used in the AOF 140, in combination with suitable pump sources 145, depending on a target wavelength range of device operation.

When suitably pumped, the AOF 140 may support lasing in a broad wavelength range ΔΛ, which may cover a plurality of wavelength channels commonly defined for optical communications. By way of example, ΔΛ may exceed 35-40 nm when the AOF 140 is embodied as an EDF. Accordingly, the EC circuit 130 may include an optical filter, which is indicated in FIGS. 1, 3-5 at 137 and in FIG. 2 at 138, which is configured to have a high optical loss at all wavelength within the gain bandwidth ΔΛ of the AOF 140 except for the one or more distinct wavelengths $\lambda_i$, which it may thereby select for lasing. By tuning or adjusting the optical filters 137, 138 to vary these distinct wavelengths, the hybrid chip-fiber devices 100a-100f may operate in a broad wavelength range defined by the gain spectrum of the AOF 140. By way of example, the AOF 140 implemented with an EDF may support lasing in the C-band of wavelength of DWDM spectrum, e.g. from about 1525 nm to about 1570 nm by way of example. An AOF doped with ytterbium may be used for lasing in the 1000-1100 nm wavelength range, with neodymium for lasing in the 1080-1100 nm range, or with thulium for lasing in the 1.9-2.1 μm wavelength range.

A fraction of light generated in the AOF 140 and coupled into the EC circuit 130 of chip 110 may be tapped off with an optical coupler 122 and guided to the LP circuit 120 with a connecting optical waveguide. In some embodiments the optical coupler 122 may be in the form of a directional optical coupler or tap, as illustrated in FIGS. 1-3, 5 and 6. In some embodiments it may be in the form of a bi-directional coupler as described below with reference to FIG. 4. In some embodiments the optical coupler 122 may be disposed to tap off laser light upstream of the optical filter 137 or 138, as illustrated in FIGS. 1-3, 5 and 6. In some embodiments the optical coupler 122 may be disposed to tap off laser light downstream of the optical filter 137, or to tap off laser light propagating from the optical filter 138 toward the EC port 113 in the embodiment of FIG. 2.

FIGS. 1, 3-6 illustrate example embodiments 110a, 110c-110f of chip 110 wherein the photonic chip includes two EC ports 111, 112 for connecting to opposite ends of the AOF 140 to close an optical loop, and wherein the optical filter 137 operates in transmission. FIG. 2 illustrates an example embodiment 110b of chip 110 that couples to the AOF 140 through one bidirectional EC port 113. The EC ports 111-113 may be, for example, in the form of edge ports configured for coupling to an optical fiber. The EC ports 111-113 may also be implemented at etched groves or as vertical ports, e.g. with diffraction gratings or reflective surfaces in some embodiments. The EC ports 111-113 may also be referred to herein as the AOC ports.

Referring to FIG. 2, it illustrates an example embodiment 110b of chip 110 that couples to the AOF 140 through a bidirectional EC port 113. The EC circuit 130b is coupled to the bi-directional EC port 113 of the chip and includes an optical filter 138 that operates in reflection. An optical fiber 132 may connect the EC port 113 to the AOF 140 through a circulator 152. In this embodiment light generated in the AOF 140 that exits from its first end 141 is directed by the circulator 152 to the EC port 113 of the photonic chip 110b, and is guided to the optical filter 138. A portion of the light that is reflected from the optical filter 138 exits the chip from the same EC port 113, to be coupled by the circulator 152 into the second end 142 of the AOF 140, thereby closing a laser loop. In some embodiments the optical coupler 122 may be in the form of a directional coupler. In some embodiments the optical coupler 122 may be in the form of a bi-directional coupler, for example as described below with respect to FIG. 4.

Referring to FIGS. 1-6, in some embodiments one or more connecting optical fibers 151 and/or 153 of a suitable length may be provided to connect the ends of the AOF 140 to the EC ports 111, 112 in the embodiments of FIGS. 1, 3-6, or to the first and third ports of the circulator 152 in the embodiment of FIG. 2. In some embodiments one or both ends of the AOF 140 may be optically coupled to the AOF port 111, 112, or 113 of the chip, or to the respective ports of the circulator 152, without an intermediate connecting fiber. In some embodiments the connecting optical fibers 151 and 153 may be polarization-maintaining.

Light generated in the AOF 140 may generally propagate in both directions within the AOF. In some embodiments an optical isolator 158 may be provided to break this directional symmetry and to select a specific propagation direction for the laser light in the EC circuit 130. In some embodiments the EC fiber laser 150 may support bi-directional propagation of light. In some embodiments the EC circuit 130 may include a bi-directional optical coupler, such as that illustrated in FIG. 4, to couple the laser light from the EC circuit 130 to the LP circuit 120 regardless of the direction of propagation of the light in the EC circuit 130.

FIGS. 1 and 2 illustrate embodiments wherein an optical isolator 158 is disposed off-chip optically between the AOF 140 and the photonic chip 110. In these embodiments the optical isolator 158 may also suppress undesired back-reflections into the AOF 140, for example from the fiber/chip interface.

Figure 3:
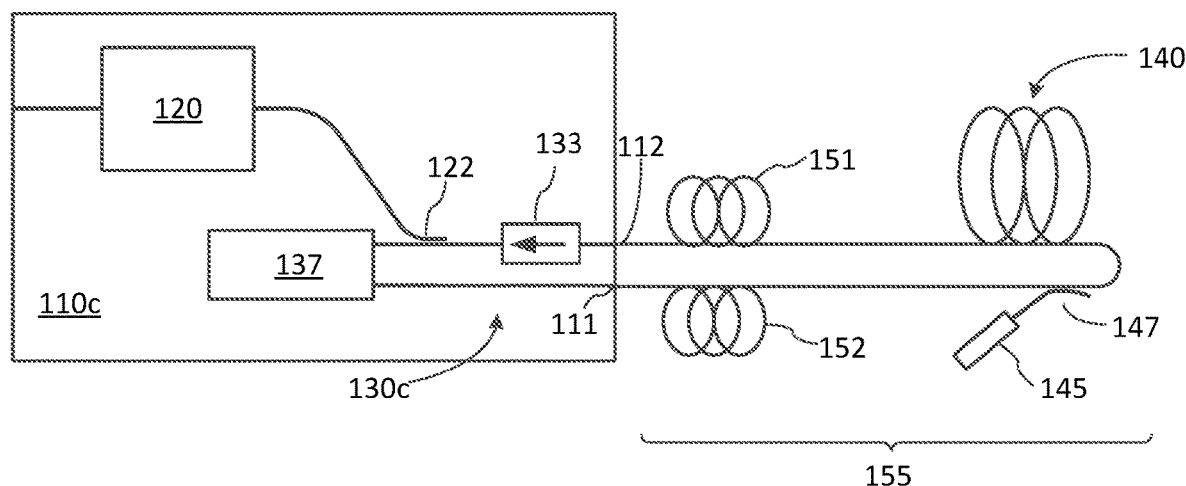
FIG. 3 is a schematic diagram of an example PIC having two EC ports connected to an active fiber loop, and an on-chip optical isolator in an EC circuit of the PIC.
Figure 5:
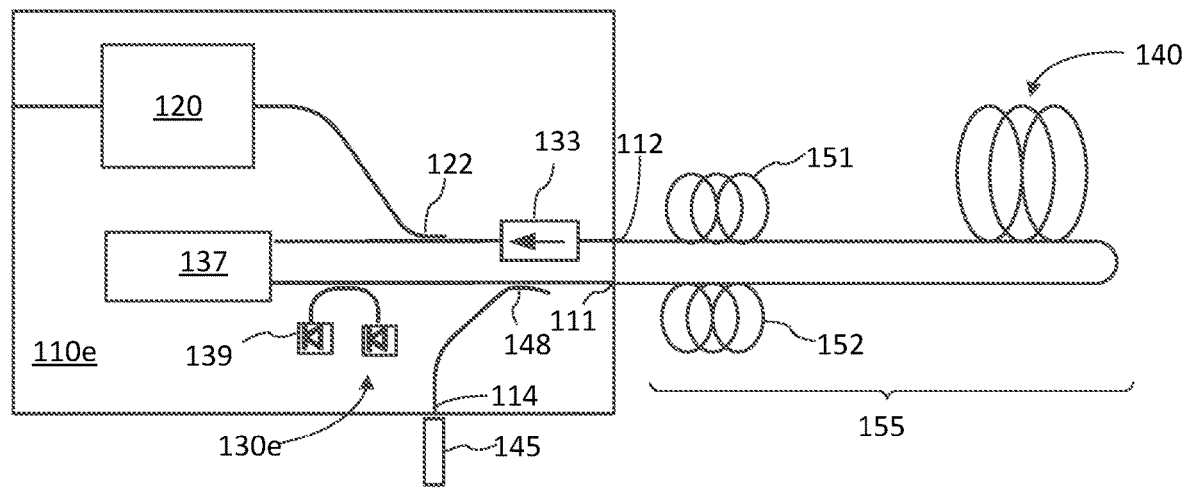
FIG. 5 is a schematic diagram of an example PIC having two EC ports connected to an active fiber loop, and an EC circuit including an on-chip optical isolator and an on-chip pump combiner.
Figure 6:
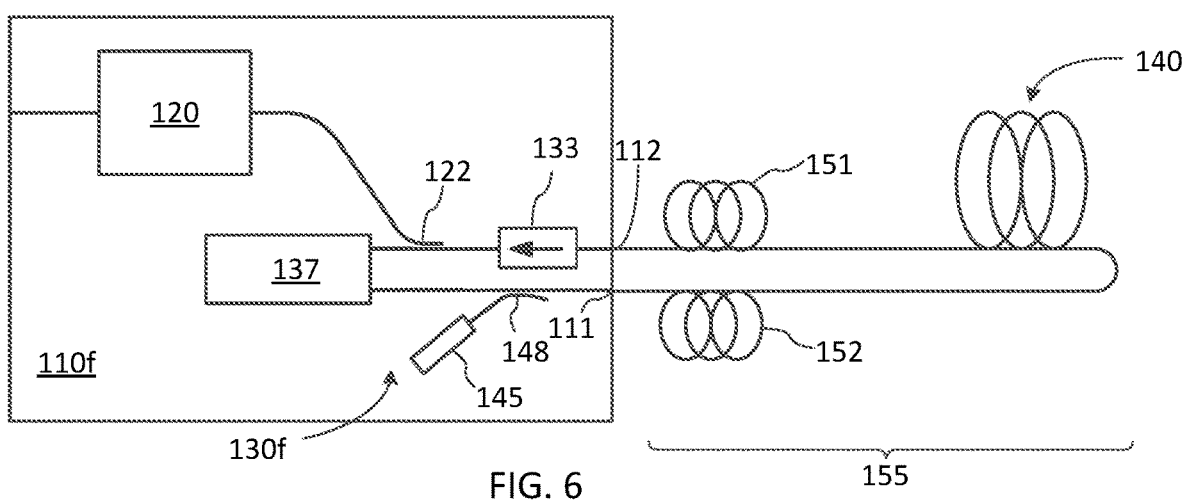
FIG. 6 is a schematic diagram of an example PIC having two EC ports connected to an active fiber loop, and an EC circuit including an on-chip optical isolator and an on-chip pump.

FIGS. 3, 5, and 6 illustrate embodiments wherein the optical isolator 158 is provided within the EC circuit 130 of the photonic chip. An on-chip optical isolator may be embodied, for example, with a waveguide ring resonator incorporating magneto-optical garnets, as described for example in an article "On-chip optical isolation in monolithically integrated non-reciprocal optical resonators", by Lei Bi et al, Nature Photonics, Vol. 5, December 2011, which is incorporated herein by reference, and U.S. Pat. No. 8,396,337 which is incorporated herein by reference. In some embodiments such non-reciprocal ring resonators may combine the optical isolator functionality with the functionality of an optical filter to select one or more wavelengths for lasing.

Figure 4:
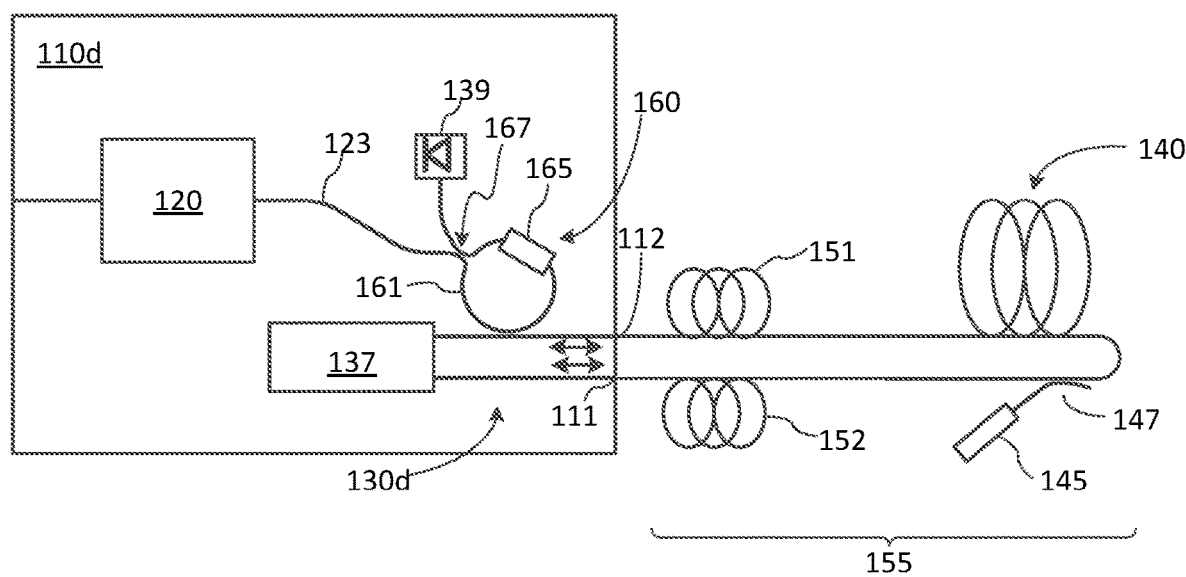
FIG. 4 is a schematic diagram of an example PIC having two EC ports connected to an active fiber loop, and an on-chip active bi-directional ring-based coupler in an EC circuit of the PIC.

FIG. 4 illustrates a hybrid optical device 100d that is absent of an optical isolator, and where the laser light generated in the AOF 140 may propagate through the optical filter 137 in either direction, from a first EC port 111 to the second EC port 112, and vice versa from the second EC port 112 to the first EC port 111. In this embodiment, an optical coupler that couples an EC circuit 130 to the LP circuit 120 may be embodied as a bi-directional coupler 160 that is configured to couple the laser light from the EC circuit 130d into the LP circuit 120 via a connecting waveguide 123 regardless of the direction of light propagation in the EC circuit 130d. The bi-directional coupler 160 is configured to tap off, into a connecting waveguide 123, a fraction of light propagating in the EC circuit 130d in a first direction, e.g. from EC port 111 to EC port 112, combined with a fraction of light propagating in the EC circuit 130d in a second direction, e.g. from EC port 112 to EC port 111. The bi-directional coupler 160 may include a 2×2 optical coupler 167 and a waveguide loop 161 that interconnects two input ports thereof. The waveguide loop 161 is optically coupled to the EC circuit 130d, for example by evanescent coupling. Other suitable 2×2 optical couplers may also be used, such as for example a multi-mode interference (MMI) coupler. One of the output ports of the 2×2 optical coupler 167 is coupled to the connecting waveguide 123 that connects it to the LP circuit 120. The other output port of the 2×2 optical coupler 167 may be coupled to a monitoring photodetector (MPD) 139. An electrically tunable phase shifter 165 may be provided in the waveguide loop 161. The phase shifter 165 may be controlled in operation to vary the optical length of the waveguide loop 161 so as to minimize optical power into the MPD 139, thereby directing light propagating in the waveguide loop 161 in either direction to the LP circuit 120 through the connecting waveguide 123.

FIG. 5 illustrates an example embodiment wherein a photonic chip 110e includes an on-chip optical isolator 133 as described above, and further includes an on-chip pump combiner 148 configured to couple pump light into the EC circuit 130e, so as to direct the pump light into the AOF 140 via an EC port 111 of the chip. The on-chip pump combiner 148 may be embodied for example as an evanescent directional coupler that is configured to couple light at the pump wavelength λp into an optical waveguide connecting the optical filter 137 to one of the EC ports 111 and 112. In the illustrated embodiment the photonic chip 100e includes an optical waveguide that connects the pump combiner 148 to a pump port 114 of the chip. A pump source 145 that may be external to the photonic chip 100e and may be optically coupled to the pump port 114, for example using an optical fiber (not shown) and/or suitable coupling optics. In this embodiment, the active optical fiber tail 155 of the hybrid chip-laser device 100f may be all-fiber, comprising no other optical components or devices.

The EC ports 111 and 112 and the pump port 114 may all be disposed at a same edge of the chip, or may be disposed at different edges or sides of the chip. In some embodiments the pump combiner 148 may be disposed for co-directional pumping of the AOF 140, as illustrated in FIG. 5. In some embodiments the pump combiner 148 may be disposed for counter-directional pumping of the AOF 140. For example, in the embodiment illustrated in FIG. 5 the pump combiner 148 may be disposed optically between the optical isolator 133 and the EC port 112, which in the illustrated example operates as an input port for the light generated in the AOF 140. In some embodiments the optical isolator 133 and the optical coupler 122 may be replaced with a bi-directional coupler such as the active bi-directional coupler 160 as described above with reference to FIG. 4, or a coupler followed by a splitter.

Continuing to refer to FIG. 5, in some embodiments one or more MPDs 139 may be coupled to the EC circuit 130e for monitoring one or more aspects of operation of the EC laser that is formed with the EC circuit and the active fiber 140. In the illustrated embodiment, two MPDs 139 are disposed for monitoring light that propagates in the EC 130e in either direction. Other embodiments may include either a smaller or a greater number of the MPDs; for example in some embodiments an on-chip MPD may be provided to monitor the optical power of the pump light received in the pump port 114.

FIG. 6 illustrates a photonic chip 110f that is a modification of the photonic chip 110e of FIG. 5 in which both the pump combiner 148 and the pump source 145 are disposed on-chip. In some embodiments the photonic chip 100f may be a silicon photonic chip, such as a SOI chip, and the pump source may be a 980 nm laser diode that is integrated with the photonic chip 110f using hybrid integration. In such embodiments, the only off-chip element of the hybrid chip-laser device 100f may be the active optical fiber tail 155 that may be all-fiber, comprising no bulk optic components or devices.

Photonic chips used in a hybrid chip-fiber device of the type described above with reference to FIGS. 1-6 may include, in addition to an EC circuit 130 that connects to an active optical fiber tail 155 to for an EC fiber laser, one or more LP circuits 120 that use light generated in the EC fiber laser to perform a specific function. In some embodiments the LP circuit 120 may be configured to perform an optical communication function using the light tapped off from the EC circuit 130, for example as a part of an optical transmitter, an optical receiver, or an optical transceiver. This function or functions may include modulation of the tapped-off light for transmitting an optical signal, and/or mixing the tapped-off light with a received optical signal for coherent detection thereof.

Figure 7A:
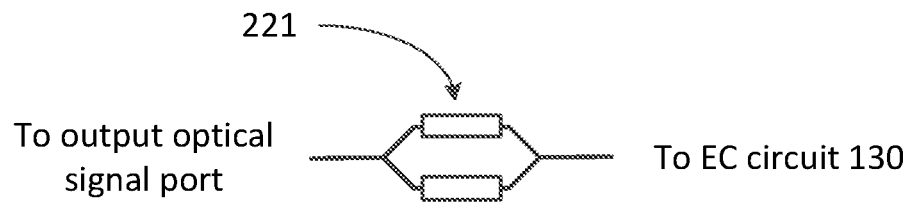
FIG. 7A is a schematic diagram of a light processing circuit in the form of a Mach-Zehnder modulator (MZM)
Figure 7B:
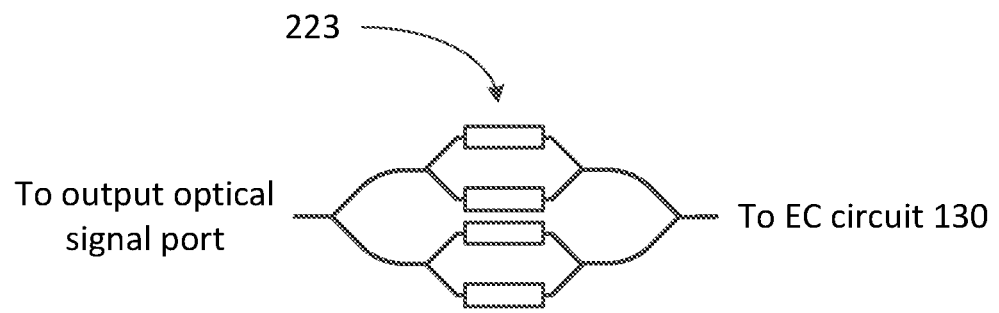
FIG. 7B is a schematic diagram of a light processing circuit in the form of an IQ modulator formed with a nested MZM.
Figure 7C:
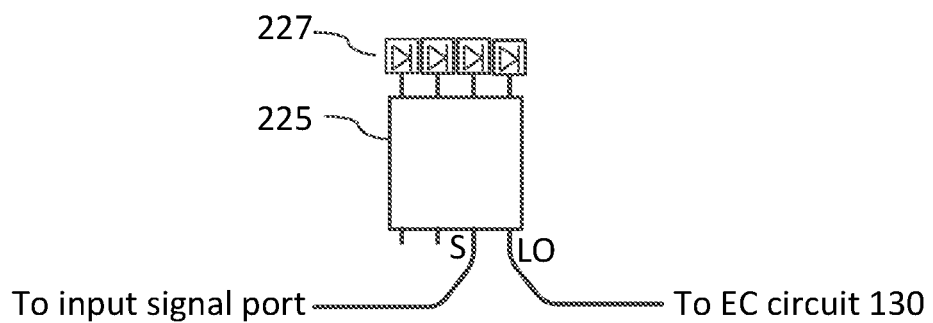
FIG. 7C is a schematic diagram of a light processing circuit in the form of an optical phase diversity receiver including a 90° optical hybrid.

FIGS. 7A-7C schematically illustrate example embodiments of the light processing circuit 120. It will be appreciated however that the light processing circuit 120 is not limited to these embodiments, and may also include other elements and sub-circuits that may be useful in an integrated optical transmitter or an integrated optical receiver, including but not limited to polarization beam splitters, polarization beam combiners, polarization rotators, polarization controllers, mode converters, dispersion compensators, variable optical attenuators, MPDs, optical isolators, optical taps, and optical couplers. The light processing circuit 120 may also be referred to as the second optical circuit or, in some embodiments, as the communication (COM) circuit.

Referring first to FIG. 7A, in some embodiments the LP circuit 120 may be in the form of, or include, a Mach-Zehnder modulator (MZM) 221, and may implement for example a PAM optical transmitter. The MZM 221 may be connected optically between the EC circuit 130 of the photonic chip 110 and an output optical signal port of the photonic chip 110. An MPD (not shown) may be coupled to the output of the MZM 221 for bias monitoring.

Referring to FIG. 7B, in some embodiments the LP circuit 120 may be in the form of, or include, a nested MZM 223 that may be operated as an optical quadrature modulator to generate QPSK or QAM optical signals. The nested MZM 223 may be connected optically between the EC circuit 130 of the photonic chip 110 and an output optical signal port of the photonic chip 110. One or more MPDs (not shown) may be coupled to the output of inner MZMs and/or at the output of the nested MZM 223 for bias monitoring.

Referring to FIG. 7C, in some embodiments the LP circuit 120 may be in the form of, or include, a 90° optical hybrid 225 coupled to an array of four PDs 227 to implement a coherent phase diversity detection of an optical signal that may be received by the photonic chip. One of the input port of the optical hybrid 225 may be coupled to an input optical signal port of the photonic chip (not shown), while another input port of the optical hybrid 225 may be coupled to the EC circuit 130. Light received from the EC circuit 130 serves as local oscillator (LO) light to be coherently mixed with the optical signal light received by the chip. Other types of optical mixer may be used in place of the 90° optical hybrid 225 in some embodiments.

Several example embodiments of the optical filters 137 and 138 will now be described with reference to FIGS. 8A-12B, each of which schematically illustrating a portion of a photonic chip where an on-chip EC circuit comprising the optical filter may be implemented. Although the EC circuits illustrated in these figures show primarily optical elements implementing a reflective or transmissive filter, and may not show optical elements having other functionality such as optical isolators, directional couplers, pump mixers, optical taps, MPDs, polarizers, polarization splitters, and the like so as not to overwhelm the drawings, it will be appreciated that such elements may be present in embodiments of the EC circuits described below, for example as described above with reference to FIGS. 3-6.

Figure 8A:
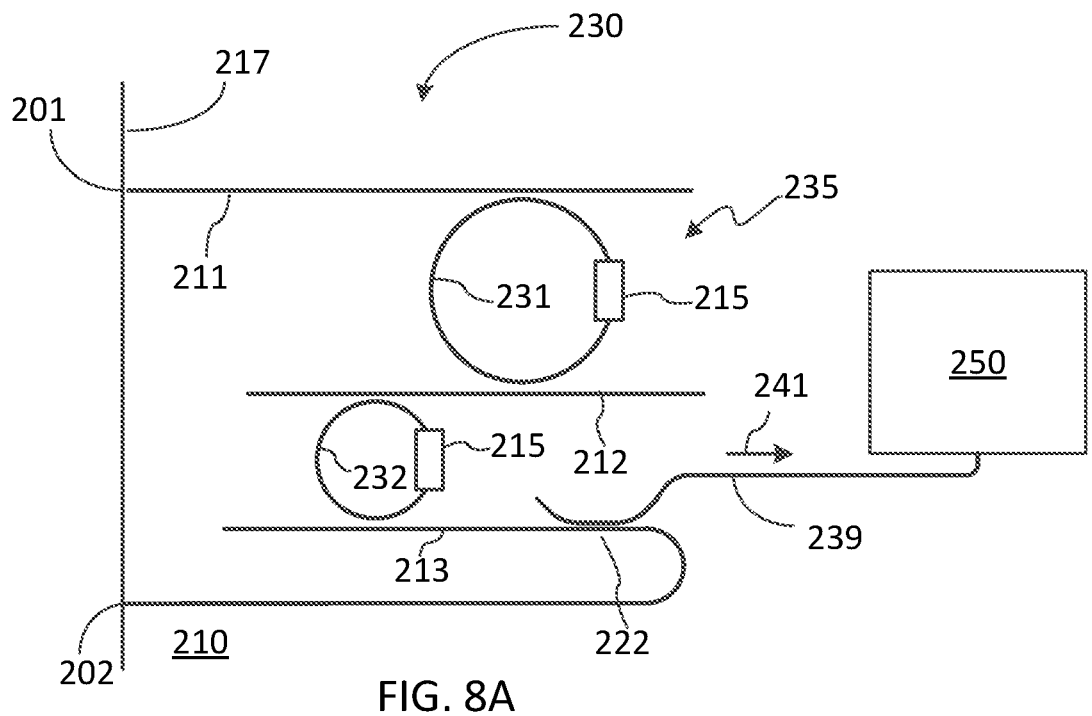
FIG. 8A is a schematic diagram of an external-cavity (EC) portion of an example PIC with a single-path dual-ring Vernier (DRV) filter connecting two EC ports.

FIG. 8A illustrates an example EC circuit 230 of a photonic chip 210 that may be used to embody an on-chip EC circuit, such as the two-port EC circuit 130a of FIG. 1, that is configured to couple to an AOF to form an EC fiber laser as described above. The EC circuit 230 may be implemented with optical waveguides as a PIC formed in a photonic chip 210, which may be an embodiment of the photonic chip 110a of FIG. 1. The EC circuit 230 includes a first optical waveguide 211 connected to a first EC port 201, a second optical waveguide 213 connected to a second EC port 202, and a dual-ring Vernier (DRV) filter 235 optically coupling the first optical waveguide 211 to the second optical waveguide 213. The EC circuit 230 provides a wavelength-selective optical path between the EC ports port 201 and 202. The first EC port 201 and the second EC port 201 may be embodiments of the EC ports 112 and 111 of chip 110a of FIG. 1, respectively. The EC ports 201, 202 may be disposed at a same edge 217 of chip 210 as illustrated in FIG. 8A, or may be formed at different edges of the chip if desired by suitably routing the waveguides 211, 213. The EC ports 201, 202 may also be implemented at etched groves or as vertical ports, e.g. with diffraction gratings or reflective surfaces in some embodiments.

The DRV filter 235 is formed of two ring resonators 231, 231 of different size that are optically coupled in series through an intermediate waveguide 212. The first ring resonator 231 may be evanescently coupled to the input optical waveguide 211 and the intermediate optical waveguide 212, which operates as a drop port of the first ring resonator 231. The second ring resonator 232 may be evanescently coupled to the intermediate optical waveguide 212 and the output optical waveguide 213, with the latter operating as its drop port.

Figure 9A:
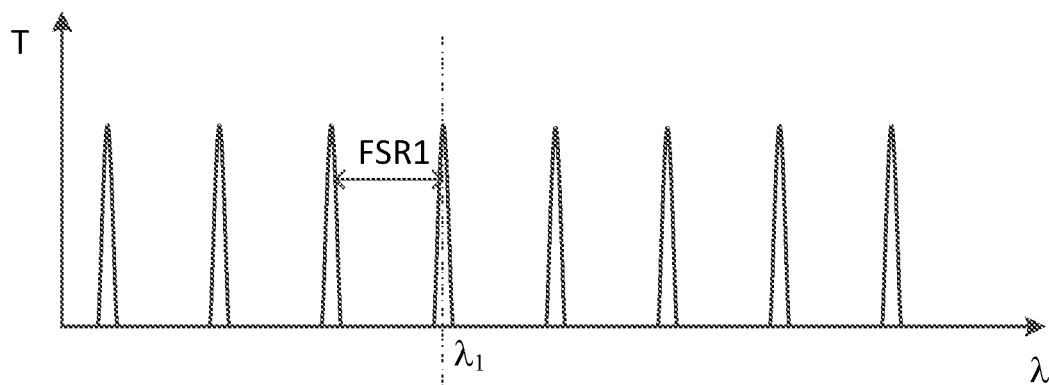
FIG. 9A is a graph schematically illustrating a drop-port transmission spectrum of a ring resonator.
Figure 9B:
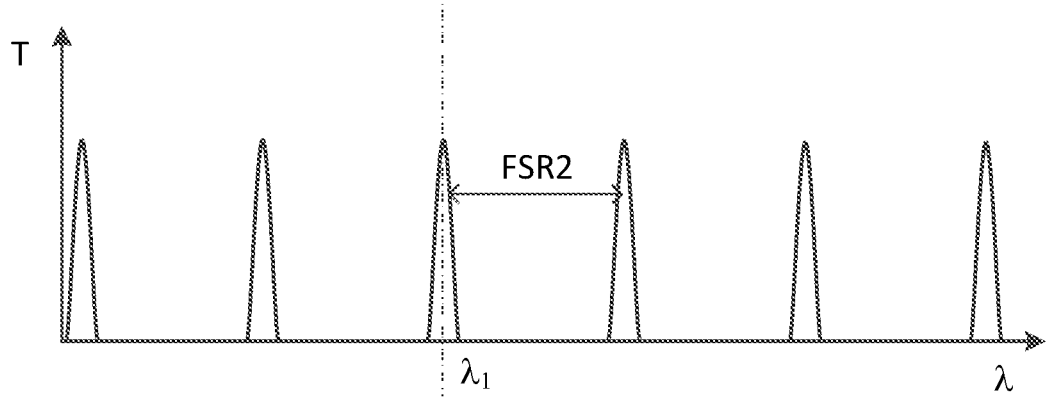
FIG. 9B is a graph schematically illustrating a drop-port transmission spectrum of a ring resonator of a radius that is smaller than the radius of the ring resonator of FIG. 9A.
Figure 9C:
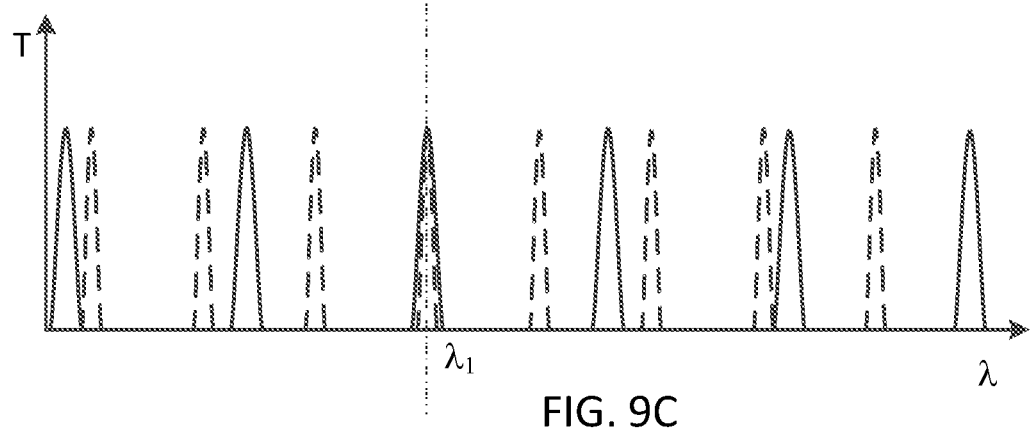
FIG. 9C is a graph combining drop-port transmission spectra of the ring resonators of FIGS. 9A and 9B to illustrate the operation of a DRV filter.

Referring now also to FIGS. 9A-9C, each of the ring resonators 231, 232 operate as a comb filter, transmitting light between the two optical waveguides it is coupled to at a plurality of wavelengths that are equally spaced in frequency, while suppressing most of the wavelengths in-between. FIGS. 9A and 9B schematically illustrate example comb-like transmission spectra $T(\lambda)$ of the ring resonators 231 and 232. The separation between adjacent transmission peaks defines the free spectral range (FSR) of the ring resonator. In the illustrated example the ring resonator 231 has a bigger radius, and has a relatively smaller FSR denoted as FSR1 in FIG. 9A, while the ring resonator 232 has a smaller radius, and has a relatively greater FSR that is denoted as FSR2 in FIG. 9B, with the ratio of FSR2>FSR1. At least one of the ring resonators 231, 232 may be provided with a phase shifter 215 for electrically tuning the spectral position of the transmission peaks, i.e. tuning the transmission peak wavelengths $\lambda_j$, by adjusting the refractive index in a portion of a waveguide forming the ring resonator. The one or more phase shifters 215 may be embodied for example with resistive heaters, p/n junctions, or any other device capable of changing the effective refractive index in a waveguide using an electrical signal. The transmission characteristic $T_{DRV}(\lambda)$ of the DRV 325 is a product of the transmission characteristic $T_1(\lambda)$ of the first ring resonator 231 and the transmission characteristic $T_2(\lambda)$ of the second ring resonators 232, $T_{DRV}(\lambda)=T_1(\lambda) \cdot T_2(\lambda)$. By making the two ring resonators 231, 232 of different size, so that FSR2 is not equal to FSR1 or an integer multiple thereof, and by wavelength tuning one of the ring resonators to align one of its transmission peaks with one of the transmission peaks of the other ring resonator as illustrated in FIG. 9C at a desired wavelength $\lambda_1$, the DRV filter 235 may be made to preferentially transmit the wavelength $\lambda_1$ while suppressing substantially all other potentially lasing wavelengths within the gain spectrum of an AOF such as an EDF, thereby enabling lasing at this wavelength when an optically-pumped AOF is connected between the input port 201 and the output port 202.

In some embodiments a directional coupler 222 may be provided to couple, or tap off, light from the EC circuit 230 to an LP circuit 250 that may be disposed in the same chip. In some embodiments the LP circuit 250 may be implemented in a separate photonic chip. The direction of light propagation in the EC circuit 230 defines the orientation of coupler 222. FIG. 8A illustrates an embodiment wherein light generated in an external AOF propagates from the first EC port 201 to the second EC port 202; in this embodiment, the first EC port may be referred to as an input EC port, the second EC port 202 may be referred to as the output EC port, and the first and second optical waveguides 211, 213 may also be referred to as the input and output waveguides of the EC circuit 230, respectively. The coupler 222 may be disposed at various locations along an optical path between the EC ports 201, 202. In other embodiments where the light propagates in opposite direction the orientation of the directional coupler 222 may be reversed. In some embodiments it may be replaced with a bi-directional coupler such as that described above with reference to FIG. 4. The LP circuit 250 may be an embodiment of the LP circuit 120 described above, and in some embodiments may be a PIC implementing an optical transmitter and/or an optical receiver. A connecting waveguide 239 may be provided for guiding tapped-off light 241 to the LP circuit 250.

Figure 8B:
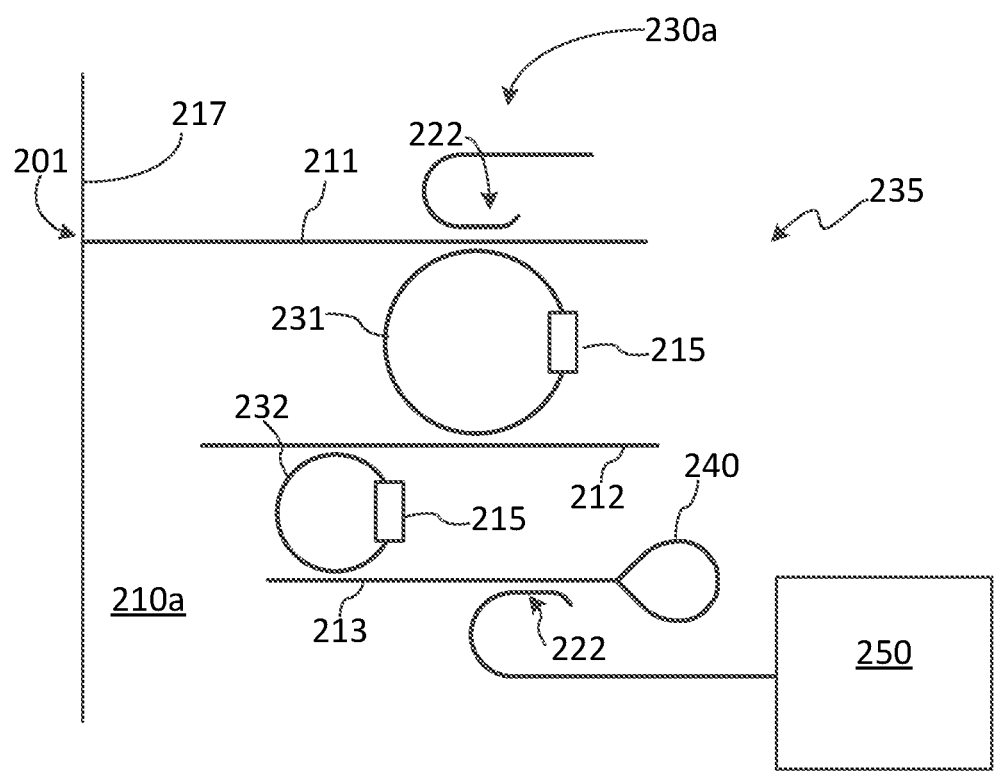
FIG. 8B is a schematic diagram of an EC portion of an example PIC with a double-path DRV filter connected to a EC port.

FIG. 8B illustrates a variation of the EC circuit 230 of FIG. 8A, generally referred to as the EC circuit 230a, which is modified to operate in reflection, and which may embody the optical filter 138 of FIG. 2. The EC circuit 230a includes the first EC port 201, which may be an embodiment of the EC port 113 of FIG. 2, and which may function as a bi-directional optical port for connecting to an AOF, for example using a circulator as illustrated in FIG. 2. In operation EC port 201 receives light from the AOF connected thereto (not shown), and returns a wavelength-selected portion of the light back into the AOF. Similarly to the EC circuit 230 of FIG. 8A, the EC circuit 230a includes the DRV filter 235 that couples the first waveguide 211 to the second waveguide 213 at a selected wavelength $\lambda_1$. The second waveguide 213 terminates with a reflector 240, that reflects light transmitted through the DRV filter 235 back toward the AOC port 201, passing through the DRV filter 235 a second time. The reflector 240 may be embodied, for example, as a Sagnac loop mirror that may be formed on-chip as a waveguide loop. The DRV filter 235 thus operates in a double-pass configuration, which increases its wavelength selectivity and the suppression of undesired wavelengths. In some embodiments the DRV filter 235 may be disposed within the Sagnac loop. The coupler 222 may be disposed at various locations along an optical path between the reflector 240 and the EC port 201, two of which illustrated in FIG. 8B by way of example.

Figure 10A:
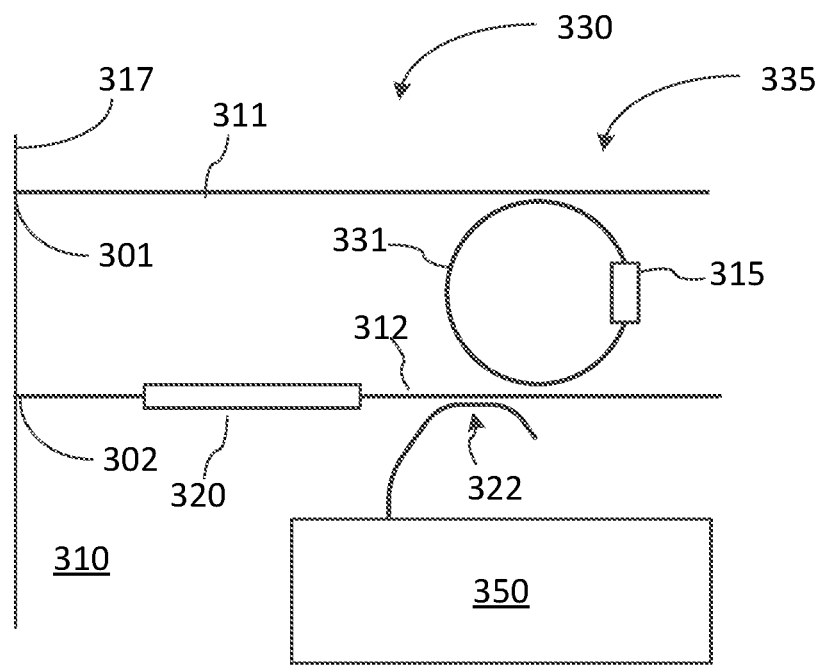
FIG. 10A is a schematic diagram of an EC portion of an example PIC with two EC ports connected by a ring comb filter in sequence with a phase modulator.

FIG. 10A illustrates an example EC circuit 330 that is implemented in a photonic chip 310 and may operate in transmission to provide optical feedback to a length of an AOF to cause it to lase at a plurality of wavelengths. The EC circuit 330 may be an embodiment of the two-port EC circuit 130a of FIG. 1. The EC circuit 330 may be implemented with optical waveguides as a PIC formed in the photonic chip 310, which may be an embodiment of the photonic chip 110a of FIG. 1. The EC circuit 330 includes a first optical waveguide 311 connected to a first EC port 301, a second optical waveguide 312 connected to a second EC port 302, and a comb optical filter 335 in the form of a ring resonator 331. The comb optical filter 335 optically couples the first optical waveguide 311 to the second optical waveguide 312 at a plurality of distinct wavelength. An optical coupler 322 taps off a portion of light propagating in the EC 330, which may be then guided to a light processing circuit 350. In some embodiments the light processing circuit 350 may be implemented in the photonic chip 310. In some embodiments the light processing circuit 350 may be implemented in a separate photonic chip. The first and second optical waveguides 311, 312 may also be referred to in this embodiment as the input and output waveguides of the EC circuit 330, respectively. The EC ports 301 and 302 may be embodiments of the EC ports 112 and 111 of chip 110a of FIG. 1, respectively. These ports may be implemented for example as edge ports at an edge 317 of the photonic chip 310, at different edges of the chip, or within the chip so as to allow coupling to an optical fiber.

The ring resonator 331 couples the first waveguide 311 to the second waveguide 312 at a sequence of transmission wavelengths $\lambda_i$ of the ring resonator 331, as defined by the transmission function peaks of a ring resonator generally illustrated in FIG. 9A. By suitably selecting the radius of the ring resonator 331, its FSR may be made to correspond to a target wavelength spacing, such as for example a wavelength spacing defined for WDM communications. The ring resonator 331 may include a phase shifter 315 to enable electrical tuning the transmission wavelengths $\lambda_i$ of the ring resonator 331 to coincide with a target wavelengths set. When connected to opposite ends of an AOF to form an EC fiber laser as described above, the EC circuit 330 may operate as a comb filter that selects for lasing a plurality of the peak-transmission wavelengths $\lambda_i$ that lie within a gain bandwidth of the AOF. However the optical gain spectrum of an AOF, such as erbium-doped fiber, may be largely homogeneously broadened. The homogeneous gain broadening of the AOF may result in mode competition and mode hopping effects, which may prevent stable multi-wavelength operation of the EC fiber laser formed with the EC circuit 330 and the AOC connected thereto. To alleviate the mode competition and enable multi-wavelength operation, the EC circuit 330 may include a phase modulator 320 disposed in series with the comb filter 335. In operation the phase modulator 320 may be driven by an oscillating electrical signal to elastically expand and contract the length of the laser cavity. The frequency $f_{PM}$ and/or amplitude $\Delta\phi$ of the phase modulation may be selected to effectively re-distribute the spectral power between the wavelengths $\lambda_j$ of the selected wavelength set and to equalize the optical power in different wavelengths of the set. The phase modulation effectively extends and contracts the cavity length, temporally modulating the laser wavelength that will preferentially oscillate in the cavity. A stable multi-wavelength lasing may be achieved if the rate $f_{PM}$ of modulation is comparable to or higher than the relaxation rate of the laser medium, which may prevent the appearance of a single dominant lasing mode, and which for erbium-doped fiber may correspond to $f_{PM}$ on the order of tens of kHz or higher. See for example "Multiwavelength Erbium-Doped Fiber Ring Laser Incorporating an SOA-Based Phase Modulator" by Jian Yao, et al., IEEE Photonics Technology Letters, Vol. 17, No. 4 (2005). By increasing the amplitude $\Delta\phi$ of the phase modulation, the number of stable lasing modes can be increased. The phase modulator 320 may be embodied for example with p/n junctions, or with a resistive heater in some embodiments.

Figure 10B:
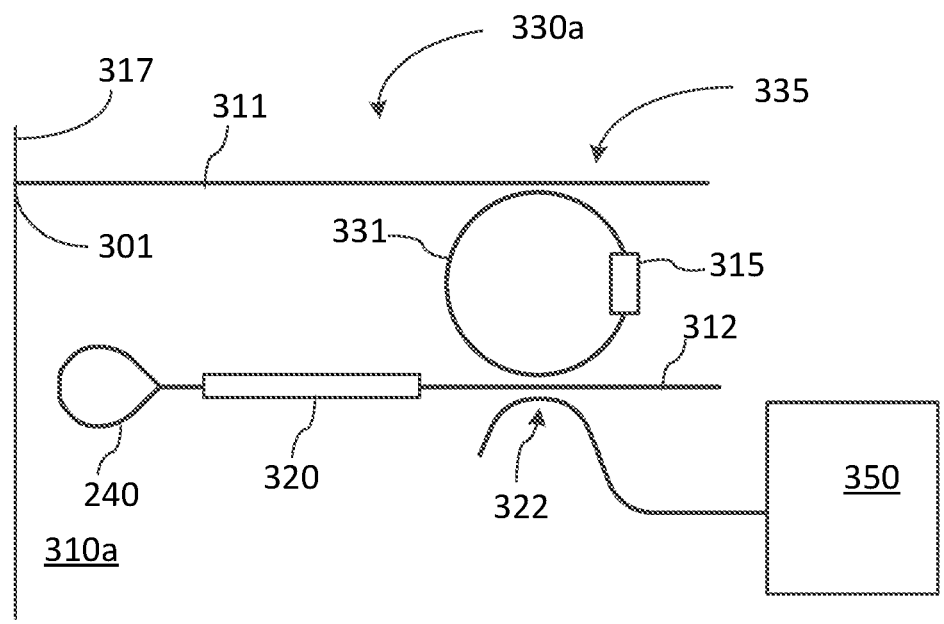
FIG. 10B is a schematic diagram of an EC portion of an example PIC with a EC port connected to a reflective EC circuit including a double-pass chain of a ring comb filter and a phase modulator.

FIG. 10B illustrates a variation of the EC circuit 330, generally referred to as the EC circuit 330a, which is modified to operate in reflection. The EC circuit 330a may be an embodiment of the EC circuit 130b of FIG. 2. The EC circuit 330a includes an optical port 301, which in operation functions as a bi-directional optical port through which light generated by an external AOF may be coupled into the EC circuit 330a, and selected wavelengths of the light are returned to the AOF to enable lasing at those wavelengths. The optical port 301 may be an embodiment of the AOF port 113 of FIG. 2. In some embodiments the optical port 301 may be connected to an external AOF loop, such as AOF 140 of FIG. 2, using an optical circulator. The EC circuit 330a of FIG. 10B is similar to the EC circuit 330 described above except that the second optical waveguide 312 terminates at a reflector 240 that reflects light transmitted through the comb filter 335 back toward the AOC port 301 through the comb filter 335. The reflector 240 may be embodied, for example, as a Sagnac loop mirror that may be formed on-chip as a waveguide loop. The comb filter 335 and the phase modulator 320 operate in a double-pass configuration, which increases their efficiency in selecting wavelengths for lasing. The EC circuit 330a may be implemented in a photonic chip 310a which may also include a light processing circuit 350. The photonic chip 310a may be an embodiment of the photonic chip 110b of FIG. 2. A portion of the light propagating in the EC circuit 330a is tapped off with a coupler 322 and is guided to the light processing circuit 350. In some embodiments coupler 322 may be replaced with a bi-directional coupler that couples light propagating to and from the reflector 240 into a same connecting waveguide for guiding to the LP circuit 350, such as for example described above with reference to FIG. 4.

Figure 11:
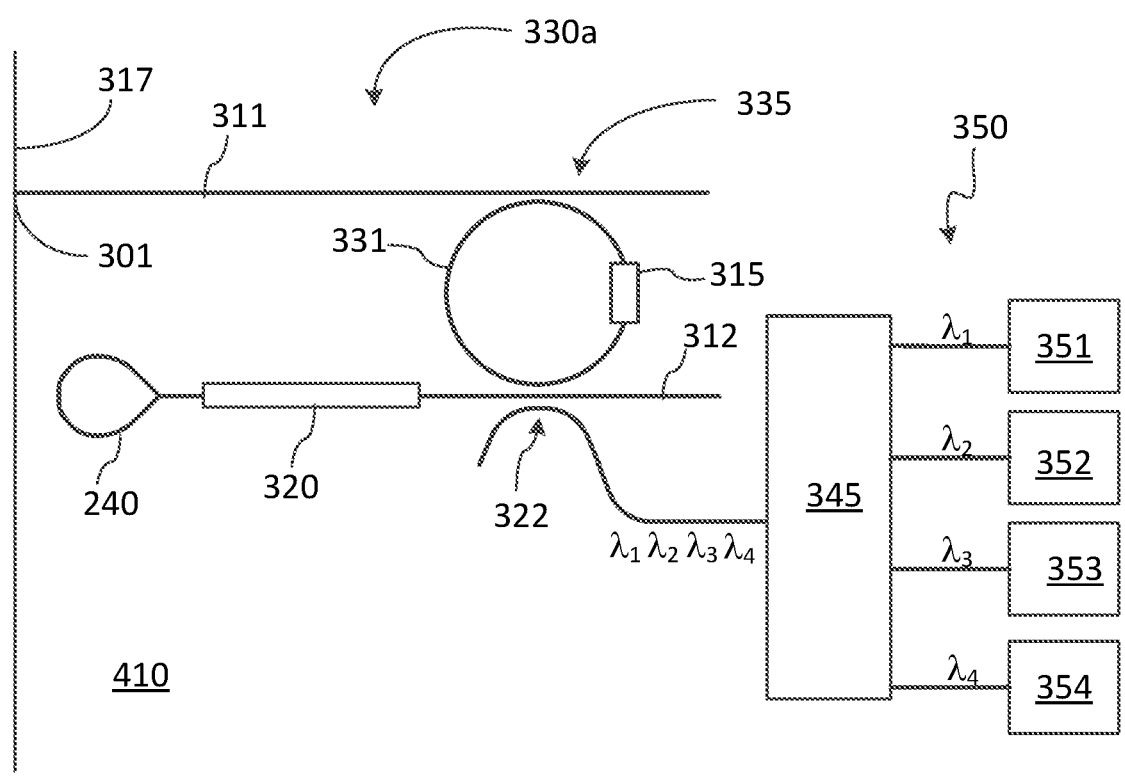
FIG. 11 is a schematic diagram of an example PIC with an EC circuit optically coupled to a wavelength demultiplexer, the EC circuit including a comb filter and a phase modulator.

FIG. 11 illustrates a photonic chip 410 that includes an instance of the EC circuit 330a as described above that is coupled to a wavelength demultiplexer (DEMUX) 345. The DEMUX 345 may be implemented with optical waveguides within the photonic chip 410, and may be configured to demultiplex the wavelengths $\lambda_i$ that may be selected by the comb filter 335 for lasing when the EC circuit 330a is coupled to an AOF. In the illustrated example, the comb filter 335 is configured to select for lasing wavelengths $\lambda_1$, $\lambda_2$, $\lambda_3$, $\lambda_4$ from a gain spectrum of an AOF that is coupled to the optical port 301, and the DEMUX 345 is configured to spatially separate these four wavelengths and output them over four different waveguides, to be provided to a plurality of single-channel circuits 351-354. Generally the number of wavelengths to be demultiplexed may be different than four, for example in the range from 2 to 40 or more. Each of the optical circuits 351-354 may represent a PIC of an optical transceiver, and may include at least one of an optical modulator or an optical mixer. In some embodiments one or more of the single-channel circuits 351-354 may include an optical modulator configured to modulate light received from the EC circuit 330a in intensity to transmit data over a wavelength channel; for example one or more of the single-channel circuits 351-454 may include an MZM as an intensity modulator, or a nested MZM structure as an IQ modulator. In some embodiments one or more of the single-channel circuits 351-354 may include a coherent optical receiver PIC incorporating an optical mixer, such as a 90° optical hybrid; in such embodiments light received from the EC circuit 330a may serve as the local oscillator (LO) light to be mixed with signal light received over a communication channel. In some embodiments the single-channel circuits 351-354 may be implemented in the photonic chip 410. In some embodiments the single-channel circuits 351-354 may be implemented in one or more separate photonic chips. The DEMUX 345 may be embodied in a variety of ways, for example with one or more Mach-Zehnder interferometers (MZIs), with an array waveguide grating (AWG), or microring resonators.

Figure 12A:
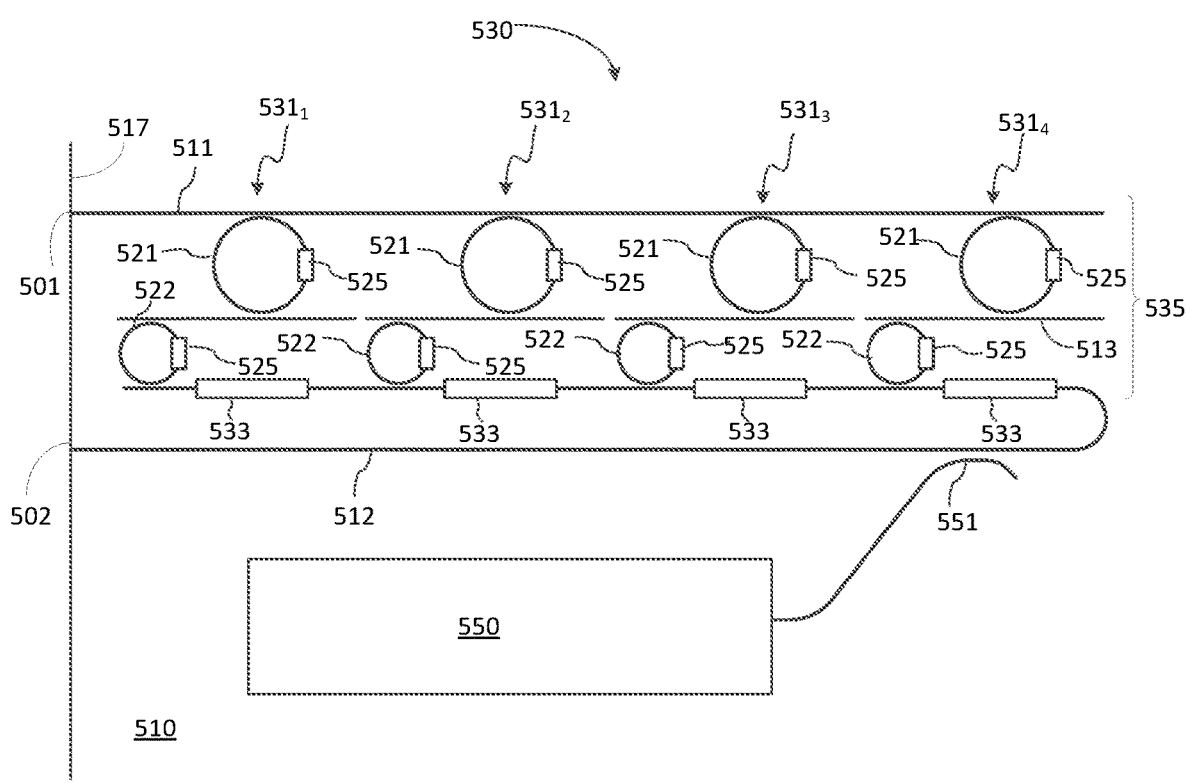
FIG. 12A is a schematic diagram of an on-chip EC circuit including a chain of DRV filters optically coupled between two EC ports of a PIC for multi-wavelength operation.
Figure 12B:
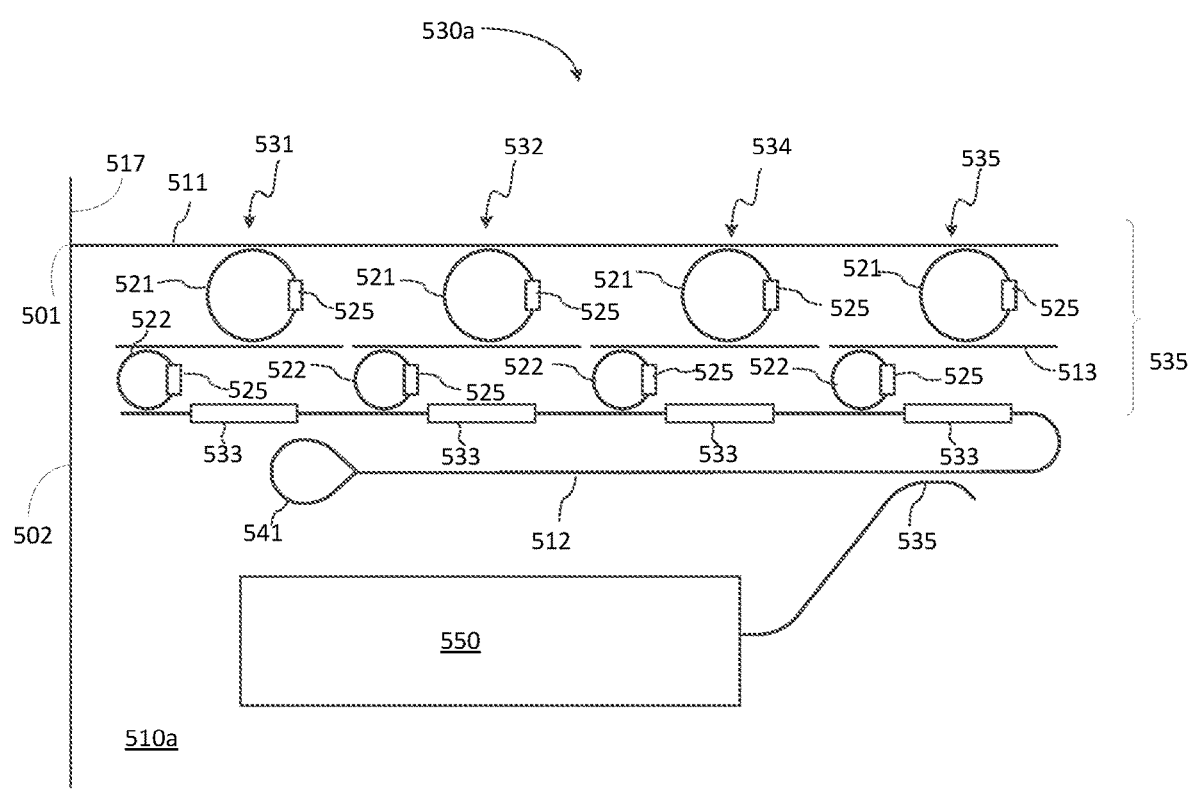
FIG. 12B is a schematic diagram of an on-chip reflective EC circuit including a chain of DRV filters optically coupled to a EC port of a PIC in double-pass configuration for multi-wavelength operation.

With reference to FIGS. 12A and 12B, in some embodiments an EC circuit of a photonic chip may include a multi-wavelength filter 535 formed of a cascade of two or more DRV filters $531_i$, i=1, . . . , N. The EC ports 501 and 502 are configured for coupling to a fiber-optic loop comprising an AOF and may be embodied as described above with reference to any of the EC ports. Each of the DRV filters $531_i$, which may be generally referred to as the DRV filters 531, couples a first optical waveguide 511 to a second optical waveguide 512 in a wavelength-selective manner, as generally described above with reference to FIG. 8A-9C. The cascade of the DRV filters 531 may be configured to extract two or more different wavelengths of light from the first optical waveguide 511 to the second optical waveguide 512. An optical coupler 551 may be provided to couple a portion of light propagating through the multi-wavelength filter 535 to a light processing circuit 550. In some embodiments coupler 551 may be a directional waveguide coupler. In some embodiments coupler 551 may be replaced with a bi-directional coupler that couples light propagating to and from the EC port 502 into a same connecting waveguide for guiding to the LP circuit 350, such as for example described above with reference to FIG. 4.

Disposing a cascade of individually tunable optical filters, such as the DRV filters 531, in the EC circuit enables controlling each of the lasing frequencies individually and to provide non-equally spaced channels to an LP circuit 550. Each of the DRV filters 531 may be an embodiment of the DRV filter 235 described above with reference to FIGS. 8A-7C, and may be formed of two ring resonators 521 and 522 of different FSR that are evanescently coupled through an intermediate waveguide or waveguides 513. In each of the DRV filters 531, at least one of the ring resonators 521, 522 may include a phase shifter 525 to align selected transmission peaks of the two ring resonators to select a wavelength for lasing. Providing each of the ring resonators 521, 522 with a phase shifter 525 enables tuning the selected wavelength to a desired spectral location. In some embodiments, one or more phase modulators 533 may be disposed optically in series with the DRV filters 531 to regulate how the optical power generated in the AOF is shared between the selected wavelengths when the EC circuit is operated as a part of an EC fiber laser. In some embodiments a different phase modulator 533 may be disposed before or after each DRV filter 531. Using multiple phase modulators 533 enables a finer control of the cavity phase to alleviate mode competition when the EC circuit is coupled to an AOF to form an EC fiber laser. Each phase modulator 533 can be tuned separately to increase or otherwise adjust the disparity in effective cavity length between different wavelengths, improving the stability of operation and potentially increasing the number of wavelengths that can stably oscillate. The phase modulators 533 can be placed at other points in the circuit, preferably so that different wavelengths travel through different number of phase modulators 533, allowing independent control of each wavelength's modulation frequency.

The light processing circuit 550 may be embodied as generally described above with reference to FIGS. 7A-7C and FIGS. 8 to 11, and may include a wavelength demultiplexer. In some embodiments the light processing circuit 550 may include one of an optical modulator configured to modulate light received from the EC circuit of the chip, and/or an optical mixer wherein the light from the EC circuit may be coherently mixed with a signal light to implement a coherent optical detector.

FIG. 12A illustrates an example photonic chip 510 wherein the multi-wavelength filter 535 is connected between a first optical port 501 and a second optical port 502 to form an EC circuit 530, which may operate in transmission to provide wavelength selective feedback to an external AOF so as to support multi-wavelength lasing. The photonic chip 510 may be an embodiment of the photonic chip 110a of FIG. 1, EC circuit 530 may be an embodiment of the EC circuit 130 of FIG. 1, and the optical ports 501, 502 may be embodiments of the AOF ports 111, 112 of FIG. 1.

FIG. 12B illustrates an example photonic chip 510a wherein the multi-wavelength filter 535 is connected between a first optical port 501 and a reflector 541 to form an EC circuit 530a, which may operate in reflection to provide wavelength selective feedback to an external AOF so as to support multi-wavelength lasing. The photonic chip 510a may be an embodiment of the photonic chip 110b of FIG. 2, EC circuit 530a may be an embodiment of the EC circuit 130a of FIG. 2, and the optical port 501 may be an embodiment of the AOF port 113 of FIG. 2.

In some embodiments one or more of the ring resonators, which in the embodiments of FIGS. 8A-12B function as optical filters to select wavelength for lasing, may be configured to incorporate magneto-optic materials so as to function as an optical isolator as well as an optical filter.

Approaches and techniques described above with reference to example embodiments may be used to implement optical transceivers that integrate in one or two photonic chips various optical elements and circuits for transmitting and receiving data-modulated light. Such photonic chips may be based on a silicon platform, such as for example a SOI platform, and may require integrating with an external light source, conventionally an off-chip laser diode. The laser's wavelength may be tuned by adjusting an external cavity which can be formed by Bragg gratings, etalons, or filters integrated on-chip. One drawback of this solution relates to packaging of off-chip laser diodes with a silicon PIC, which can be costly and complex, and scales in difficulty with the number of wavelength channels. Integrating laser diodes onto a silicon photonic chip may be associated with reduced power efficiency, lower coupling of the laser light into the silicon PIC, and may have a low yield. This approach may become particularly problematic for high-density, multi-channel configurations. Since each channel requires a separate laser bonded to the silicon chip, high-capacity links with many channels will likely have impractically low yields.

Difficulties associated with off-chip or on-chip integration of laser diodes with silicon photonic chips may compound in situations where the silicon photonic chip has to operate in high-temperature environments, such as in close proximity to a switch fabric, for instance, in high-capacity applications such as in datacenters. For these situations, it may be preferable to have the laser diodes located remotely away from the silicon photonic chip, with a fiber carrying the light to the PIC. However, each laser diode may either require a separate fiber, likely polarization-maintaining which increases cost, or an external multiplexer. Using separate fibers is associated with a higher cost that scales up with the number of channels. An external multiplexer may have a large insertion loss, usually >3 dB, which may strain the optical power budget of the system.

Using an AOF, such as for example erbium-doped fiber, as the gain medium to form a laser with an EC circuit in the photonic chip, provides several advantages, which include the ability to keep the gain media away from the photonic chip and the high ambient temperatures where the chip may operate. Furthermore, using a length of suitably doped optical fiber as the gain medium provides an easy and natural way to carry light to the transmitter and/or receiver PIC. Furthermore, as many optical transceivers already use erbium-doped fiber to amplify signal light, little in the way of additional materials or equipment is needed to implement hybrid PIC/AOF devices, examples of which are described above.

Figure 13:
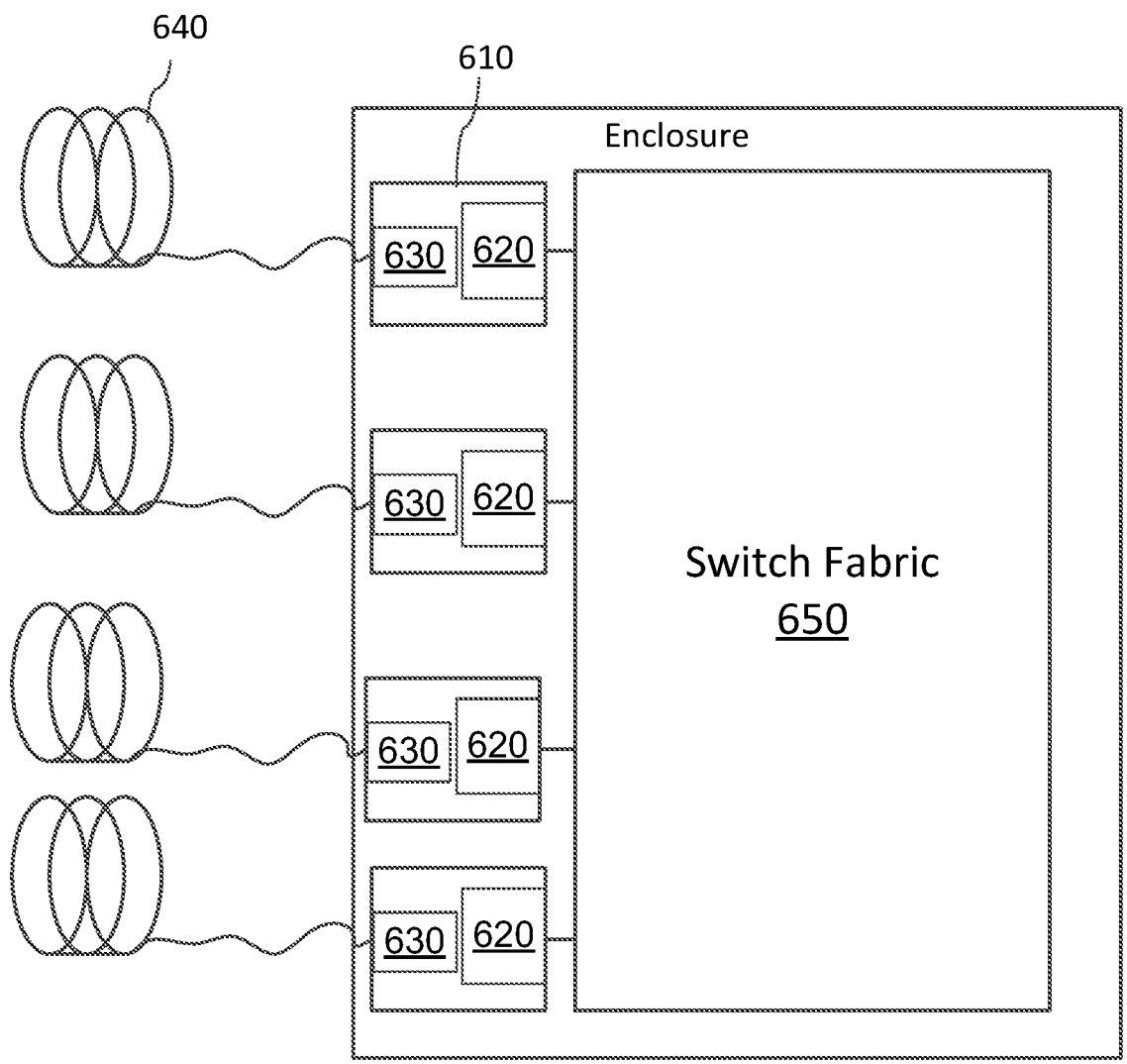
FIG. 13 is a schematic diagram of a switching sub-system of a data center with a plurality of optical transceiver PICs disposed in a high-temperature enclosure coupled to active fiber tails disposed outside of the enclosure.

With reference to FIG. 13, an example system environment may be a data center that utilizes a plurality of data servers (not shown) that are optically interconnected using a plurality of optical transceiver PICs 610 connected to switch fabric 650. The optical transceiver PICs 610 may be each in the form of a photonic chip comprising a transceiver PIC 620 coupled to the switch fabric 650. Each photonic chip further includes an EC circuit 630 coupled to an active fiber tail 640 to form an EC fiber laser partially integrated with the photonic chip as described above. The active fiber tail 640 includes a length of AOF that is disposed outside of the high-temperature enclosure, in a lower-temperature averment more conducive to light generation in the AOF.

A further advantage of the embodiments and techniques described above stem from a broad gain spectrum of active optical fibers doped with rear-earth elements such as erbium, which enables lasing at multiple wavelengths that are naturally wavelength-multiplexed into a single fiber without the need for bulk components. Furthermore, the techniques described above enable providing a high-power, single-channel lasing with narrow linewidths, which may be for example less than 100 kHz, with a lower material and packaging cost than a typical micro-ITLA.

Furthermore, optical filters integrated in a silicon chip, such as ring resonators, may be more selective and stable than bulk filters, leading to narrower linewidths. Furthermore, silicon photonics enables integration of optical filters with high-speed phase modulators to suppress mode competition and facilitate multi-wavelength lasing. Furthermore, an external cavity circuit on a silicon photonic chip is easier to temperature stabilize to prevent mode hopping. Furthermore, a silicon photonic chip with ah EC circuit may be controlled, for example by temperature, to dynamically stabilize phase changes in the AOF and its cavity to stabilize the laser wavelength.

The above-described exemplary embodiments are intended to be illustrative in all respects, rather than restrictive, of the present disclosure. Indeed, various other embodiments and modifications to the present disclosure, in addition to those described herein, will be apparent to those of ordinary skill in the art from the foregoing description and accompanying drawings. Thus, such other embodiments and modifications are intended to fall within the scope of the present disclosure. For example, it will be appreciated that semiconductor materials other than silicon, including but not limited to compound semiconductor materials of groups commonly referred to as A3B5 and A2B4, such as GaAs, InP, and their alloys and compounds, may be used to fabricate photonic chips and hybrid chip-fiber devices example embodiments of which are described hereinabove. Furthermore, photonic chips configured to be coupled to an AOF to form an EC fiber laser may include other optical devices than those described above with reference to the example embodiments, such as for example, but not exclusively, additional optical couplers, optical taps, polarization controllers, polarization beam splitters, polarization beam combiners, polarization rotators. Furthermore although the example EC circuits described above use ring resonators to select specific wavelengths for lasing, other types of single-wavelengths and multi-wavelength optical filters integrated in a photonic chip may also be used to provide this functionality, including but not limited to optical filters based on diffraction gratings, waveguide Bragg gratings, array waveguide gratings, on-chip Fabry-Perot etalons, and MZIs. Furthermore, features described herein with reference to a particular embodiment may also be applicable to other described embodiments or their modifications.

Any patent, patent application, patent application publication, journal article, book, published paper, or other publicly available material identified in the specification is hereby incorporated by reference herein in its entirety. Any material, or portion thereof, that is said to be incorporated by reference herein, but which conflicts with existing definitions, statements, or other disclosure material explicitly set forth herein is only incorporated to the extent that no conflict arises between that incorporated material and the present disclosure material. In the event of a conflict, the conflict is to be resolved in favor of the present disclosure.

Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A photonic chip comprising:
 a light processing circuit;
 an external cavity (EC) circuit configured for connecting to an active optical fiber (AOF) to form a laser cavity therewith;
 an optical coupler configured to optically couple the EC circuit to the light processing circuit for feeding light produced in the AOF to the light processing circuit; and
 one or more EC ports for connecting to the AOF, the EC circuit being optically coupled to the one or more EC ports; and
 wherein the EC circuit comprises a first waveguide, a second waveguide, and an optical filter configured to select one or more distinct wavelengths of the light received from the AOF for returning back to the AOF, the optical filter comprising a plurality of dual-ring Vernier (DRV) filters tuned to select a plurality of wavelengths;

wherein the plurality of DRV filters comprise a first micro-ring resonator evanescently coupled to the first waveguide and a second micro-ring resonator evanescently coupled to the second waveguide;

wherein the EC circuit further comprises one or more phase modulators (PMs) being disposed optically in series with the DRV filters and being configured to suppress mode competition by elastically expanding and contracting an optical length of the EC circuit at a frequency exceeding a relaxation rate in the AOF.

2. The photonic chip of claim 1 wherein the first waveguide is optically coupled to the one or more EC ports, and wherein the second waveguide is optically coupled to at least one of: a reflector, or the one or more EC ports.

3. A photonic chip comprising:
a light processing circuit;
an external cavity (EC) circuit configured for connecting to an active optical fiber (AOF) to form a laser cavity therewith;
an optical coupler configured to optically couple the EC circuit to the light processing circuit for feeding light produced in the AOF to the light processing circuit; and
one or more EC ports for connecting to the AOF; and
wherein the EC circuit is optically coupled to the one or more EC ports and comprises an optical filter configured to select one or more distinct wavelengths of the light received from the AOF for returning back to the AOF, and
wherein the optical filter comprises a comb filter configured to select a plurality of wavelengths for returning back to the AOF, and wherein the EC circuit comprises a phase modulator (PM) configured to modulate an optical length of the EC circuit at a rate greater than a relaxation rate of the AOF.

4. The photonic chip of claim 3 wherein the EC circuit comprises a micro-ring resonator optically connected in series with the PM.

5. The photonic chip of claim 3 wherein the PM comprises at least one of a p/n junction or a resistive heater.

6. The photonic chip of claim 3 wherein the optical filter comprises one or more dual-ring Vernier (DRV) filters.

7. A photonic chip comprising:
a light processing circuit;
an external cavity (EC) circuit configured for connecting to an active optical fiber (AOF) to form a laser cavity therewith;
an optical coupler configured to optically couple the EC circuit to the light processing circuit for feeding light produced in the AOF to the light processing circuit; and
an optical demultiplexer; and
wherein the EC circuit comprises a phase modulator and an optical resonator having a free spectral range (FSR), and the EC is configured to cooperate with the AOF to cause stable multi-wavelength lasing at a plurality of wavelengths spaced apart by the FSR.

8. The photonic chip of claim 7 configured for receiving or transmitting light signals, wherein the light processing circuit comprises at least one of an optical modulator or an optical mixer.

9. The photonic chip of claim 7 further comprising a pump combiner configured to couple pump light into the EC circuit.

10. The photonic chip of claim 7 wherein the one or more EC ports comprise first and second EC ports for connecting to opposite ends of the AOF, and wherein the optical filter is disposed in an optical path between the first EC port and the second EC port.

* * * * *